(12) United States Patent
Tsuda et al.

(10) Patent No.: US 11,618,107 B2
(45) Date of Patent: Apr. 4, 2023

(54) DEVICE FOR MANUFACTURING ELECTRIC COMPONENT AND METHOD FOR MANUFACTURING ELECTRIC COMPONENT

(71) Applicants: HAMANAKODENSO CO., LTD., Kosai (JP); DENSO CORPORATION, Kariya (JP)

(72) Inventors: Sadayuki Tsuda, Kosai (JP); Atsushi Furumoto, Kariya (JP); Yoshinori Suzuki, Kariya (JP)

(73) Assignees: HAMANAKODENSO CO., LTD., Kosai (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/941,125

(22) Filed: Jul. 28, 2020

(65) Prior Publication Data

US 2020/0353571 A1    Nov. 12, 2020

Related U.S. Application Data

(63) Continuation of application No. PCT/JP2019/000431, filed on Jan. 10, 2019.

(30) Foreign Application Priority Data

Feb. 2, 2018    (JP) .............................. JP2018-017400

(51) Int. Cl.
*B23K 31/02*    (2006.01)
*B23K 1/20*    (2006.01)
(Continued)

(52) U.S. Cl.
CPC ................ *B23K 31/02* (2013.01); *B23K 1/20* (2013.01); *H01R 43/0235* (2013.01); *H01R 43/0242* (2013.01); *B23K 2101/40* (2018.08)

(58) Field of Classification Search
CPC .............................. B23K 20/023; B23K 1/008
See application file for complete search history.

(56) References Cited

U.S. PATENT DOCUMENTS

| | | | | | |
|---|---|---|---|---|---|
| 1,199,530 | A | * | 9/1916 | Darrach, Jr. ......... | B23K 1/0008 |
| | | | | | 228/44.3 |
| 3,886,650 | A | * | 6/1975 | Cobaugh .............. | H05K 3/3478 |
| | | | | | 228/136 |

(Continued)

FOREIGN PATENT DOCUMENTS

| | | |
|---|---|---|
| JP | 3138486 B2 | 2/2001 |
| JP | 2003051672 A | 2/2003 |

(Continued)

*Primary Examiner* — Kiley S Stoner
*Assistant Examiner* — Carlos J Gamino
(74) *Attorney, Agent, or Firm* — Harness, Dickey & Pierce, P.L.C.

(57) ABSTRACT

An electric component manufacturing device includes a preheater that contacts and preheats a transported work, a melting heater that is downstream of the preheater in a transport direction of the work and contacts and heats the work at a temperature which is higher than a temperature of the preheater and at which a solder melts, a cooler that is downstream of the melting heater in the transport direction and contacts and cools the work, and a transporter that supports and transports the work to sequentially contact the preheater, the melting heater, and the cooler in this order. The transporter performs intermittent transport in which the work is transported from the preheater to the melting heater without stopping to contact both the preheater and the melting heater at the same time, and then the work stops on the melting heater.

9 Claims, 11 Drawing Sheets

(51) Int. Cl.
*H01R 43/02* (2006.01)
*B23K 101/40* (2006.01)

(56) References Cited

U.S. PATENT DOCUMENTS

| | | | | | |
|---|---|---|---|---|---|
| 4,310,116 | A | * | 1/1982 | Shaw | F24S 10/753 228/183 |
| 4,504,008 | A | * | 3/1985 | Kent | B23K 3/0676 156/311 |
| 4,527,731 | A | * | 7/1985 | Kent | H05K 3/3468 228/43 |
| 4,607,779 | A | * | 8/1986 | Burns | H01L 24/80 228/234.1 |
| 5,492,866 | A | * | 2/1996 | Nishikawa | H01L 23/3107 29/827 |
| 5,683,026 | A | * | 11/1997 | Kawatani | H01L 24/80 228/5.5 |
| 6,047,875 | A | * | 4/2000 | Al-Nabulsi | B23K 1/0004 228/5.5 |
| 6,092,713 | A | * | 7/2000 | Kim | H01L 25/50 228/180.21 |
| 6,347,655 | B1 | * | 2/2002 | Yamamoto | H01L 24/75 156/583.1 |
| 6,547,121 | B2 | * | 4/2003 | Foong | H01L 21/67144 228/49.1 |
| 6,648,045 | B2 | * | 11/2003 | Yamauchi | H01L 24/75 156/580 |
| 6,769,469 | B2 | * | 8/2004 | Yamada | H01L 24/75 29/829 |
| 6,799,712 | B1 | * | 10/2004 | Austen | B23K 1/008 219/413 |
| 6,840,424 | B2 | * | 1/2005 | Sung | B23K 20/008 228/180.5 |
| 8,381,963 | B2 | * | 2/2013 | Nakamura | H01L 24/97 228/256 |
| 2003/0224555 | A1 | | 12/2003 | Shiozawa | |
| 2004/0002227 | A1 | | 1/2004 | Shiozawa | |
| 2004/0245316 | A1 | * | 12/2004 | Imaoka | B23K 3/047 228/43 |
| 2006/0008759 | A1 | | 1/2006 | Shiozawa | |
| 2006/0096701 | A1 | | 5/2006 | Shiozawa | |
| 2008/0230589 | A1 | * | 9/2008 | Guth | B23K 1/0016 228/44.3 |
| 2019/0198690 | A1 | * | 6/2019 | Guo | H01L 31/1888 |

FOREIGN PATENT DOCUMENTS

| | | |
|---|---|---|
| JP | 2004006650 A | 1/2004 |
| JP | 2015077607 A | 4/2015 |

* cited by examiner

TRANSPORT DIRECTION

TRANSPORT DIRECTION

DEVICE FOR MANUFACTURING ELECTRIC COMPONENT AND METHOD FOR MANUFACTURING ELECTRIC COMPONENT

CROSS REFERENCE TO RELATED APPLICATIONS

The present application is a continuation application of International Patent Application No. PCT/JP2019/000431 filed on Jan. 10, 2019, which designated the U.S. and claims the benefit of priority from Japanese Patent Application No. 2018-017400 filed on Feb. 2, 2018. The entire disclosures of all of the above applications are incorporated herein by reference.

TECHNICAL FIELD

The disclosure in this specification relates to a device for manufacturing an electric component and a method for manufacturing the electric component.

BACKGROUND

Conventionally, a device and method for manufacturing an electric component by soldering an element to a transported work is known.

SUMMARY

According to at least one embodiment of the present disclosure, an electric component manufacturing device manufactures an electric component by soldering a part to a transported work with heat conducted to the work. The device includes a preheater, a melting heater, a cooler and a transporter. The preheater preheats the work that contacts the preheater. The melting heater is provided downstream of the preheater in a transport direction and heats the work that contacts the melting heater. The melting heater has a temperature at which a solder melts and which is higher than a temperature of the preheater. The cooler is provided downstream of the melting heater in the transport direction and cools the work that contacts the cooler. The transporter supports and transports the work such that the work sequentially contacts the preheater, the melting heater, and the cooler in this order. The transporter performs intermittent transport in which the transporter transports the work from the preheater to the melting heater without the work stopping to contact both the preheater and the melting heater at the same time, and the transporter stops the work on the melting heater.

BRIEF DESCRIPTION OF THE DRAWINGS

The details of one or more embodiments are set forth in the accompanying drawings and the description below. Other features and advantages will be apparent from the description and drawings, and from the claims.

DETAILED DESCRIPTION

Figure 1:
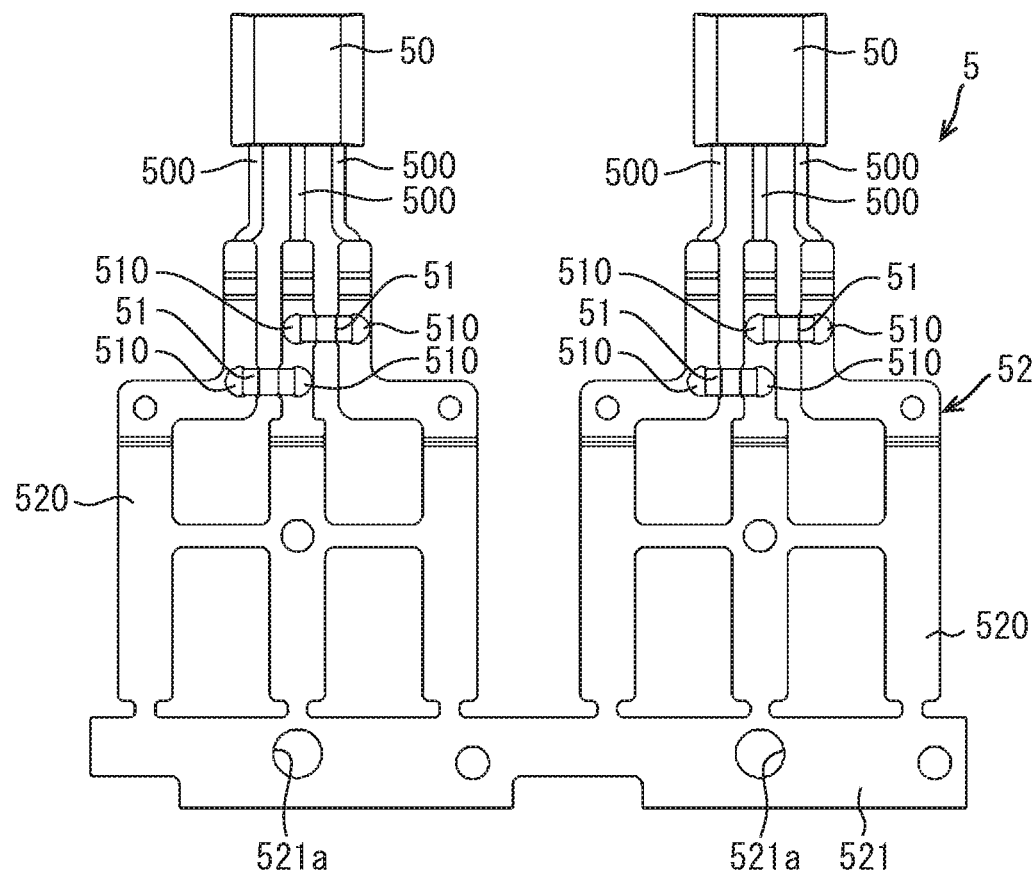
FIG. 1 is a top view of an electric component manufactured by using a manufacturing device of a first embodiment.
Figure 2:
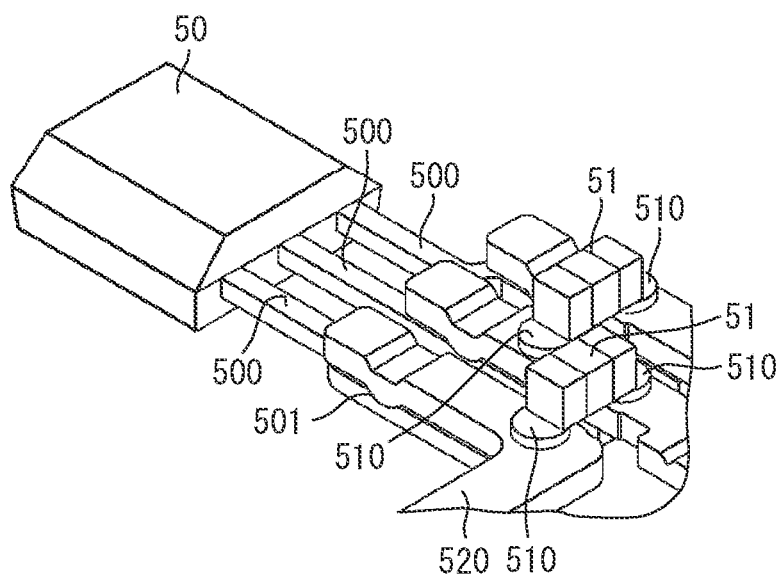
FIG. 2 is a perspective view showing a soldering portion between a terminal and an element in the electric component of FIG. 1.

Comparative examples will be described. A reflow furnace of a first comparative example includes a conveyer for conveying a work, a soldering part for cooling the work after preheating and main heating of the work for soldering, and a body forming a furnace. Hot air generators are installed above and below the conveyor in a preheating zone, and hot air generators are also installed above and below the conveyor in a main heating zone.

A manufacturing device of a second comparative example heats a work by heat transfer from a heater block to the work through a conveyor belt conveying the work, thereby performing reflow soldering by the transferred heat. This device consists of a preheating heater block that preheats the work, a reflow heater block that melts a solder paste applied to the work on a downstream side of the preheating heater block, a work cooling rate adjusting heater block, and a work cooling block. The work cooling rate adjusting heater block adjusts heating so as to reduce a cooling rate of the work on a downstream side of the reflow heater block, thereby cooling the work gently. The work cooling block rapidly cools the work on a downstream side of the work cooling rate adjusting heater block.

The device of the first comparative example has the hot air generators and the reflow furnace. Thus, the manufacturing device tends to be large.

In the second comparative example, the work is continuously conveyed by the conveyor in an area of the preheating heater block and an area of the reflow heater block. Thus, the work is heated while extending across the areas different in temperature. Due to this heated state, the temperature difference within the work in a transport direction tends to increase. Therefore, a difference in surface tension of molten solder may be generated in the work and may cause a tombstone phenomenon. Further, in the device of the second comparative example, molten solder may flow and adhere to the heater block.

In contrast to the comparative examples, the present disclosure may provide a device and method for manufacturing an electric component that can reduce a size of the device, a temperature difference within a work, and a flow of a solder.

According to one aspect of the present disclosure, an electric component manufacturing device manufactures an electric component by soldering a part to a transported work with heat conducted to the work. The device includes a preheater, a melting heater, a cooler and a transporter. The preheater preheats the work that contacts the preheater. The melting heater is provided downstream of the preheater in a transport direction and heats the work that contacts the melting heater. The melting heater has a temperature at which a solder melts and which is higher than a temperature of the preheater. The cooler is provided downstream of the melting heater in the transport direction and cools the work that contacts the cooler. The transporter supports and transports the work such that the work sequentially contacts the preheater, the melting heater, and the cooler in this order. The transporter performs intermittent transport in which the transporter transports the work from the preheater to the melting heater without the work stopping to contact both the preheater and the melting heater at the same time, and the transporter stops the work on the melting heater.

According to the electric component manufacturing device, the work is temperature-adjusted in each section along the transport direction while the work sequentially contacting the preheater, the melting heater, and the cooler, in this order. Thus, an occupied volume of the manufacturing device can be reduced. The transporter performs the intermittent transport in which the work is moved from the preheater to the melting heater and stopped in the melting heater without the work stopping to contact both the preheater and the melting heater at the same time. Hence, a period of time in which both the preheater and the melting heater simultaneously heat the work can be effectively shortened. Thus, a period of time in which the entire work is heated in the melting heater can be sufficiently secured.

Accordingly, in the process of transporting the work, it is possible to realize heating of the work so as to reduce the temperature difference within the work along the transport direction. Therefore, the electric component manufacturing device can provide downsizing of the manufacturing device and an effect of reducing the temperature difference in the work.

According to another aspect of the present disclosure, an electric component manufacturing device manufactures an electric component by soldering a part to a transported work with heat conducted to the work. The device includes a preheater, a melting heater, a cooler and a transporter. The preheater contacts and preheats the work. The melting heater is provided downstream of the preheater in a transport direction and contacts and heats a contact heated portion of the work without contacting a soldering portion of the work that is to be soldered to the part. The melting heater has a temperature at which a solder melts and which is higher than a temperature of the preheater. The cooler is provided downstream of the melting heater in the transport direction and cools the work that contacts the cooler. The transporter supports and transports the work such that the work sequentially contacts the preheater, the melting heater, and the cooler in this order.

According to the electric component manufacturing device, the work is temperature-adjusted in each section along the transport direction while the work sequentially contacting the preheater, the melting heater, and the cooler, in this order. Thus, an occupied volume of the manufacturing device can be reduced. The melting heater gives heat to the contact heated portion of the work other than the soldering portion that is to be soldered to the part. Thus, molten solder is suppressed from flowing largely and flowing toward the melting heater. Therefore, the electric component manufacturing device can provide downsizing of the manufacturing device and reduction in flow of the solder.

According to another aspect, an electric component is manufactured by a method that includes: preparing a solder on a terminal for soldering an element to the terminal; installing the element on a soldering portion of the terminal; preheating the terminal by a preheater after the installing the element, wherein the preheating by the preheater includes stopping the terminal to contact the preheater having a preheating temperature lower than a temperature at which the solder melts; heating the terminal by a melting heater after the preheating by the preheater, wherein the heating by the melting heater includes transporting the terminal stopped and preheated, and stopping the terminal to contact the melting heater having the temperature at which the solder melts; and cooling the terminal by a cooler and soldering the element to the terminal after the heating by the melting heater, wherein the cooling by the cooler includes transporting the terminal and stopping the terminal to contact the cooler having a temperature at which the solder solidifies.

According to this manufacturing method, the temperature of the work is adjusted in each section along a transport direction while the work sequentially contacting the preheater, the melting heater, and the cooler in this order. Thus, an occupied volume of the manufacturing device can be reduced. Furthermore, in the manufacturing method, the work in the stopped state is transported from the preheater to the melting heater and then stopped at the melting heating member. Thus, a period of time in which both the preheater and the melting heater simultaneously heat the work can be shortened, and a period of time in which the work is heated by the melting heater can be sufficiently secured. According to this manufacturing method, in the process of transporting the work, it is possible to realize heating of the work so as to reduce the temperature difference within the work along the transport direction. The manufacturing method for the electric component can provide downsizing of the manufacturing device and an effect of reducing the temperature difference in the work.

Hereinafter, embodiments for implementing the present disclosure will be described referring to drawings. In each embodiment, portions corresponding to the elements described in the preceding embodiments are denoted by the same reference numerals, and redundant explanation may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A first embodiment will be described with reference to FIGS. 1 to 13. In the first embodiment, examples of a device for manufacturing for an electric component and a method for manufacturing the electric component, which are capable of achieving an object disclosed in the specification, will be described. This electric component manufacturing device and manufacturing method are capable of manufacturing an electric component including a work having a configuration in which parts having thermal conductivity are soldered to each other. For example, this electric component manufacturing device and manufacturing method are capable of manufacturing an electric component including a work in which a terminal of the component is soldered to a terminal having thermal conductivity. This work can also be called a terminal on which the component is mounted or an electric component on which the component is mounted. The electric component may have one or more elements soldered to the terminal. The electric component includes, for example, a semiconductor device, but is not limited to such product.

In the electrical component manufacturing device and manufacturing method disclosed in the first embodiment, a fixed object is brought into contact with a work 52, the work 52 is directly heated via heat transfer from a solid object, and a solder provided on a soldering portion 510 is melted. Therefore, in this manufacturing device and manufacturing method, the work 52 is heated by heat transfer between solids. A first embodiment discloses an electric component 5 illustrated in FIGS. 1 and 2 as an example of an electric component that is a product manufactured by this manufacturing device or manufacturing method.

The electric component 5 includes the work 52 and a first element 50 welded to the work 52. The work 52 includes a second element 51 and a terminal 520 on which the second element 51 is mounted. The first element 50 includes terminals 500 having conductivity and extending toward the terminal 520. The first element 50 is connected to the terminal 520 via a structure in which the terminals 500 is welded to the terminal 520. This welding is completed before soldering between the second element 51 and the terminal 520. That is, the terminals 500 are already welded to the terminal 520 when the second element 51 is disposed at a predetermined position of the terminal 520.

As shown in FIG. 1, the work 52 includes two terminals 520 arranged side by side. The terminal 520 is a plate-shaped member formed by punching a conductive flat plate, for example. The work 52 includes a connecting portion 521 that connects the two terminals 520 on one end side of the work 52. The connecting portion 521 is a plate-shaped portion extending in a direction in which the two terminals 520 are arranged. The connecting portion 521 is provided with two holes 521a arranged in the direction in which the two terminals 520 are arranged. The holes 521a are supported portions supported by support devices 21 to convey the work 52 on a manufacturing line 1.

Each terminal 520 is connected to the first element 50 and the second element 51. The first element 50 is, for example, a component that constitutes an electronic circuit such as a semiconductor integrated circuit. The second element 51 is, for example, a chip capacitor such as a ceramic capacitor.

The second element 51 is integrated with the terminal 520 via a structure in which a conductive portion of the second element 51 is soldered to the soldering portion 510 of the terminal 520. The soldering portion 510 has a solder material attached thereto or coating thereon. The second element 51 is provided on the electric component 5 such that the second element 51 is mounted on the terminal 520 through the soldering portion 510. The second element 51 is provided on a part of the terminal 520 opposite and away from the holes 521a which are the supported portions.

The terminal 520 has a pressed portion that is pressed by the manufacturing device when the terminal 520 is pressed against a melting heating member 12 in order to increase a degree of contact with the melting heating member 12 at a step of melting solder in manufacturing process. This pressed portion is located between the hole 521a and the soldering portion 510. The connecting portion 521 is provided on one end part of the terminal 520, and the second element 51 is coupled to another end part of the terminal 520. The first element 50 and a welded joint portion 501 may be provided on the other end part of the terminal 520 outward of the second element 51 and the soldering portion 510. Accordingly, the connecting portion 521, the pressed portion, the soldering portion 510, and the welded joint portion 501 are arranged in this order from the one end part to the other end part of the terminal 520.

The soldering portion 510 is provided on a backside surface of the plate-shaped terminal 520 opposite a welded joint surface of the terminal 520 including the welded joint portion 501 to which the terminals 500 of the first element 50 are welded. That is, the soldering portion 510 is provided on the backside surface opposite from the welded joint surface. Each terminal 520 is equipped with two second elements 51 that are arranged in the direction in which the terminals 520 are arranged and a direction in which the terminals 500 extend.

Figure 3:
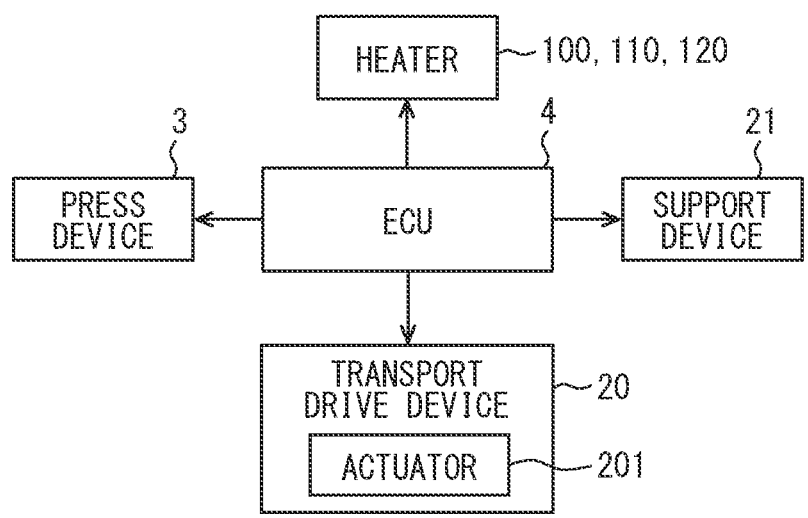
FIG. 3 is a block diagram regarding an operation of the manufacturing device according to the first embodiment.

Next, the manufacturing device and the manufacturing method will be described with reference to FIGS. 3 to 9. The manufacturing device includes the manufacturing line 1 on which the work 52 slides, a press device 3 for pressing the work 52 against the manufacturing line 1, and a transport unit 2 that transports the work 52 on the manufacturing line 1. As shown in FIG. 3, a controller 4 that controls an operation of the manufacturing device is an electronic controller that controls heaters 100, 110, 120 to individually adjust temperatures of members in the manufacturing line 1. The heater 100 is a heating device that adjusts a temperature of a preheating member 10 in the manufacturing line 1. The heater 110 is a heating device that adjusts a temperature of an intermediate heating member 11 in the manufacturing line 1. The heater 120 is a heating device that adjusts a temperature of the melting heating member 12 in the manufacturing line 1. The device for heating the preheating member 10, the intermediate heating member 11, and the melting heating member 12 may be any means as long as the device directly heats each member, and therefore the heating device is not limited to the heaters described above.

The manufacturing line 1 is provided with a recovery passage in order to recover vaporized flux, through which upper surfaces of the preheating member 10, the intermediate heating member 11, the melting heating member 12 communicate with a recovery unit. The recovery passage is configured so that suction force by a suction blower acts on the recovery passage. According to this configuration, the vaporized flux floating above the preheating member 10, the intermediate heating member 11, and the melting heating member 12 can be drawn into the recovery passage and discharged inside the recovery unit to be collected.

Further, the controller 4 is configured to control an operation of the press device 3, an operation of the support device 21, and a driving force of a transport drive device 20. The controller 4 has hardware and software for controlling the operations of the controlled object components. The controller 4 includes a device such as a microcontroller that operates according to a program as a main hardware element.

The press device 3 applies an external force to the work 52 to press the terminal 520 against a heat source at the step of melting the solder in the manufacturing method. The press device 3 drives a columnar pressing portion 30 so as to approach or separate from the manufacturing line 1 and thereby is capable of pressing the pressed portion located near the center of the terminal 520 and its surroundings with an appropriate pressure. The press device 3 has an actuator that is controlled to actuate the pressing portion 30 between a contact state in which the pressing portion 30 presses the terminal 520 against the manufacturing line 1 and a non-contact state in which the pressing portion 30 is separated from the terminal 520. Since the operation in the contact state increases a degree of contact between the terminal 520 and the manufacturing line 1, the press device 3 is an example of a contact force increaser that provides a force for increasing the degree of contact between the work 52 and the manufacturing line 1.

The support device 21 supports the terminal 520 in order to move the work 52 on the manufacturing line 1 in the manufacturing method. The support device 21 can support the terminal 520 by fitting the hole 521a of the terminal 520 onto a pin-shaped portion provided in the transport unit 2 sliding laterally of the manufacturing line 1. The transport drive device 20 provides a driving force for transporting the transport unit 2 in a direction along the manufacturing line 1. The transport drive device 20 drives the transport unit 2 in a state where the support device 21 supports the terminal 520. The transport drive device 20 has an actuator that drives the transport unit 2 so as to perform intermittent transport in which the work 52 is step-transported according to a predetermined transport speed, a predetermined transport distance, and a predetermined stop time. By this operation, a large temperature difference in the terminal 520 can be prevented at the step of melting the solder, and the manufacturing can be performed so that failure in solder joint in the work 52 does not occur. The support device 21 corresponds to a support that supports the work 52 such that the work 52 is slidable on the preheating member 10, the melting heating member 12 and a cooling number 13. The transport unit 2 corresponds to a transporter including the support.

Figure 4:
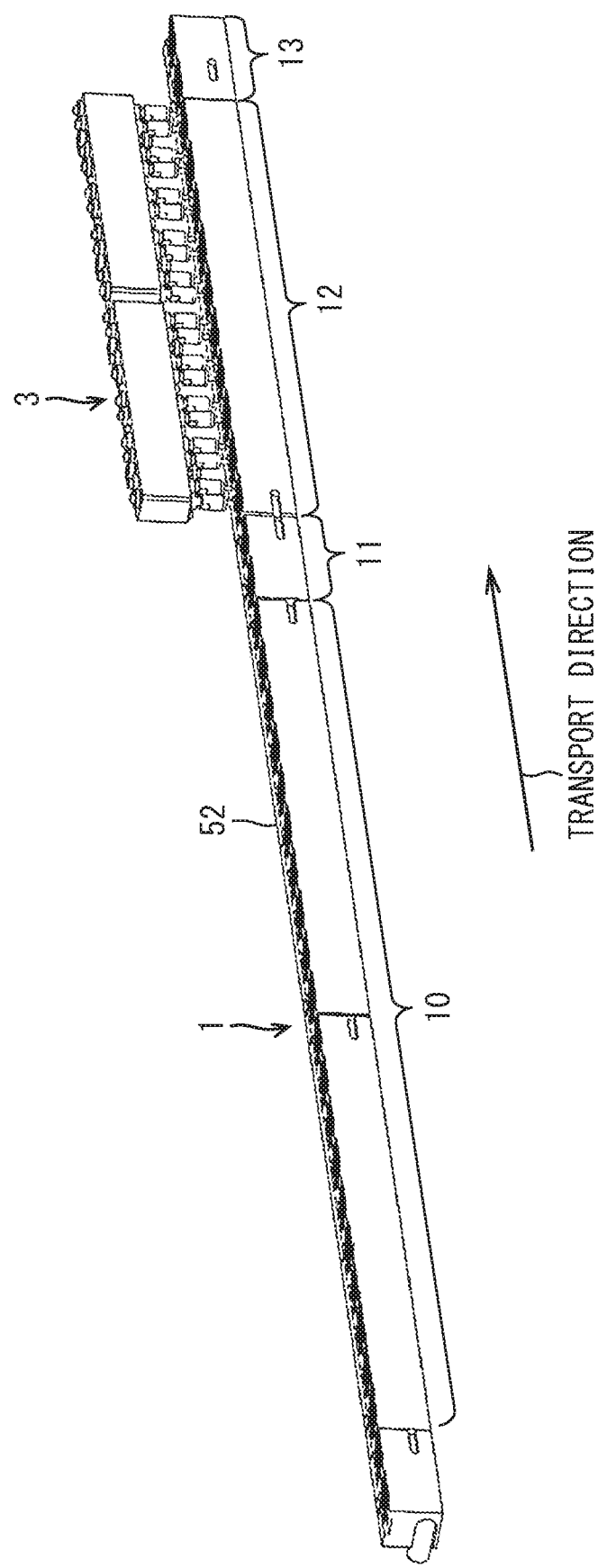
FIG. 4 is a perspective view showing the manufacturing device without a transport unit, according to the first embodiment.
Figure 5:
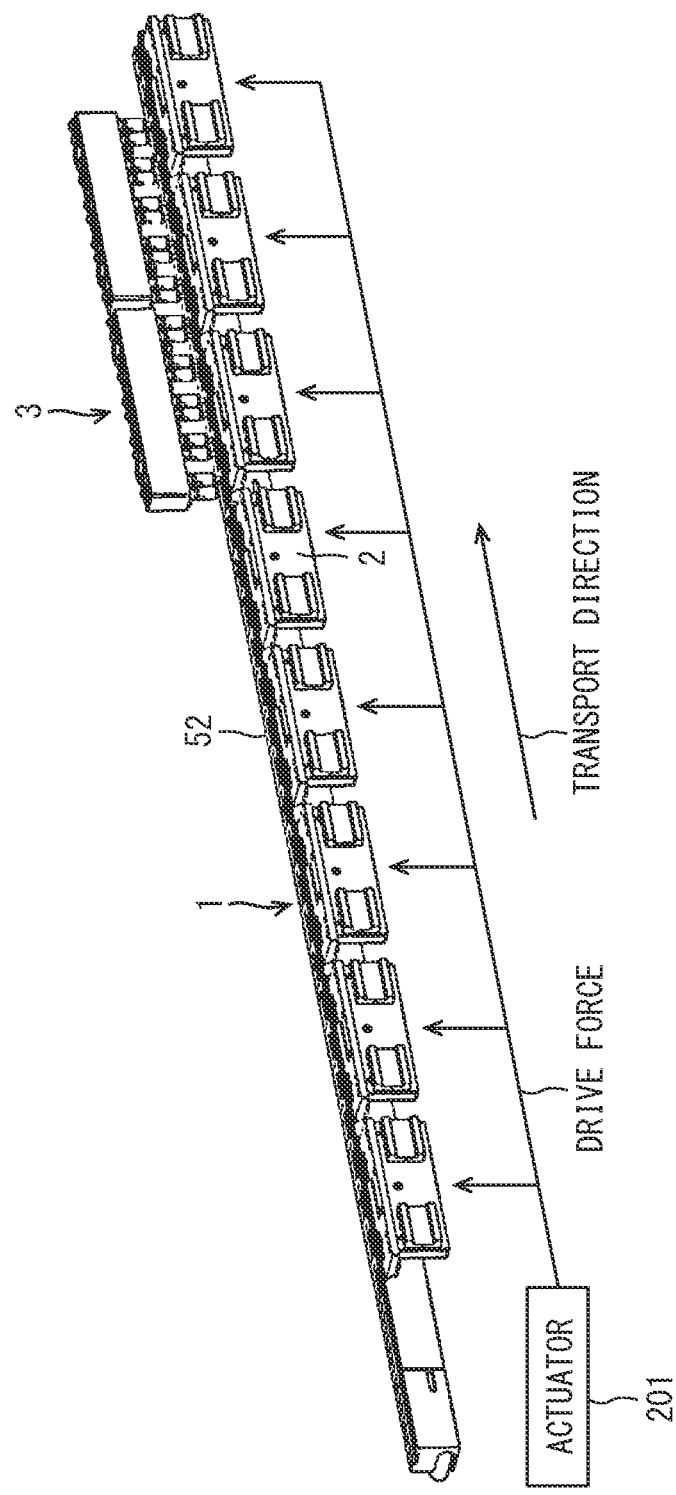
FIG. 5 is a perspective view showing the manufacturing device according to the first embodiment.

FIG. 4 shows the manufacturing device, but the transport unit 2 is omitted in order to facilitate understanding of the manufacturing line 1. FIG. 5 shows a regular manufacturing device in which the transport unit 2 is added to FIG. 4. On the manufacturing line 1, a large number of works 52 are arranged side by side in the transport direction of the transport unit 2. The large number of works 52 lined up on the manufacturing line 1 are moved by a predetermined pitch from the stopped state in the transport direction by the transport unit 2 shown in FIG. 5, and then stopped again for the predetermined stop time. In the example of this embodiment, the predetermined pitch is set so that the works 52 are moved by two by two or one by one in accordance with a dimension of the intermediate heating section that is shortest in dimension in the transport direction. According to this transport pitch, it is possible to avoid a situation where the work 52 stops and extends over two adjacent sections in the manufacturing process.

The manufacturing line 1 includes a preheating section, an intermediate heating section, a melting heating section, and a cooling section. The preheating section includes the preheating member 10 that preheats the work 52 which is in contact with the preheating member 10. The preheating member 10 constitutes an area where the work 52 is preheated before a temperature of the terminal 520 rises to a temperature at which the solder melts. The preheating member 10 is configured to be longer in dimension in the transport direction than the melting heating section in order to secure sufficient time for preheating. The preheating member 10 is set to a temperature, for example, in range of 140° C. to 180° C. by the heater 100. The preheating section is an example of a preheater that contacts and preheats the work 52.

The intermediate heating section is provided transport-downstream of the preheating section. The term "transport-downstream" means a position further advanced in a direction in which the transport unit 2 proceeds in the manufacturing process. The intermediate heating section includes the intermediate heating member 11 that heats the work 52 which is in contact with the intermediate heating member 11 such that the work 52 becomes higher in temperature than in the preheating section. The intermediate heating member 11 constitutes an area where the temperature of the terminal 520 approaches a solder meltable temperature at which the solder can melt. The intermediate heating member 11 is configured to be shorter in dimension in the transport direction than the preheating section and the melting heating section. The intermediate heating member 11 is set to a temperature included between the temperature of the preheating section and the temperature of the melting heating section. For example, the intermediate heating member 11 is set to a temperature in range of 180° C. to 220° C. by the heater 110. The intermediate heating section is an example of an intermediate heater that is provided between the preheating section and the melting heating section and contacts and heats the work 52.

The melting heating section is provided transport-downstream of the preheating section and the intermediate heating section. The melting heating section includes the melting heating member 12 that heats the work 52 which is in contact with the melting heating member 12 such that the work 52 becomes higher in temperature than in the preheating section and the intermediate heating section. A temperature of the melting heating member 12 is set such that the temperature of the terminal 520 contacting the melting heating member 12 becomes the solder meltable temperature. For example, the melting heating member 12 is set to a temperature in range of, for example, 230° C. to 250° C. by the heater 110. That is, the solder provided on the soldering portion 510 is a material that melts when the terminal 520 is controlled in this temperature range. For example, a material having a melting temperature of 217° C. may be used for the solder. The melting heating section is an example of a melting heater that is downstream of the preheating section and contacts and heats the work 52 at a temperature at which the solder melts.

Figure 7:
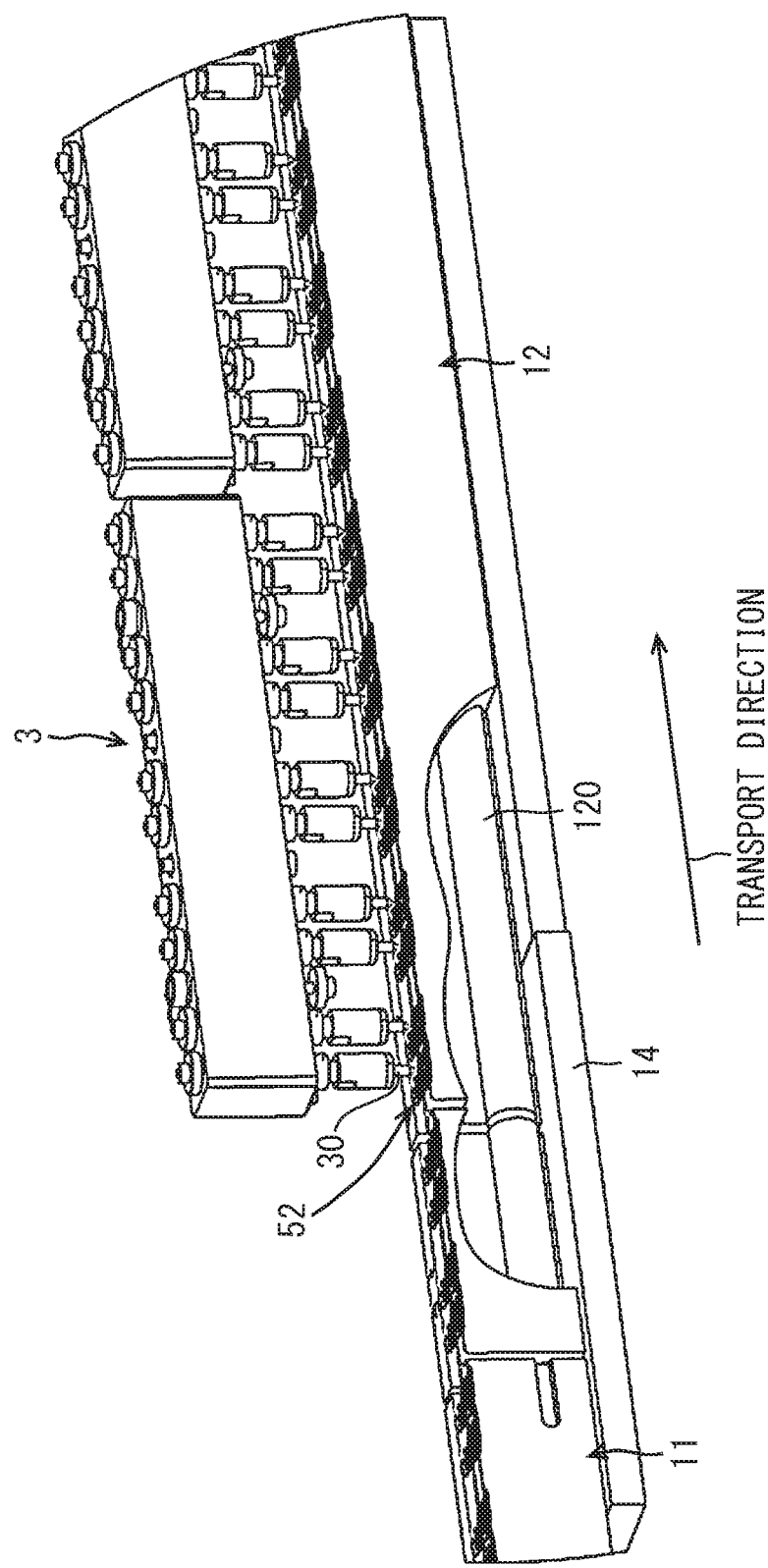
FIG. 7 is a partial perspective view showing the manufacturing device in which a degree of contact between a work and a melting heating section is increased by the press device, according to the first embodiment.

FIG. 7 shows a state immediately before the press device 3 applies pressing force to all the works 52 stopped in the melting heating section. In this state, each pressing portion 30 is located immediately above the center of the corresponding work 52. Then, all the works 52 stopped in the melting heating section are pressed against the melting heating member 12 by the press device 3. Accordingly, the degree of contact between the melting heating member 12 and the work 52 is enhanced, and an efficiency of heat transfer between the solids can be increased.

The cooling section is provided transport-downstream of the melting heating section. The cooling section includes a cooling member 13 that cools the work 52 which is in contact with the cooling member 13. A temperature of the cooling member 13 is controlled, for example, by heat absorption of fluid flowing inside the cooling member 13. The temperature of the terminal 520 in contact with the cooling member 13 becomes the temperature at which the solder solidifies.

The manufacturing device illustrated in FIG. 4 and other drawings is not limited to the number of works 52, the stop time, and the transport time described in this embodiment, and can be configured by various combinations. For example, the preheating member 10, the intermediate heating member 11, the melting heating member 12, and the cooling member 13 are blocks which are different in length in the transport direction but similar in transverse cross-sectional shape, and are next to each other in this order, thereby forming the manufacturing line 1. In the manufacturing process, for example, twenty works 52 are arranged on the preheating member 10, two works 52 are arranged on the intermediate heating member 11, ten works 52 are arranged on the melting heating member 12, and two works 52 are arranged on the cooling member 13. The manufacturing line 1 may also be formed of the preheating member 10, the melting heating member 12, and the cooling member 13, excluding the intermediate heating member 11.

Figure 6:
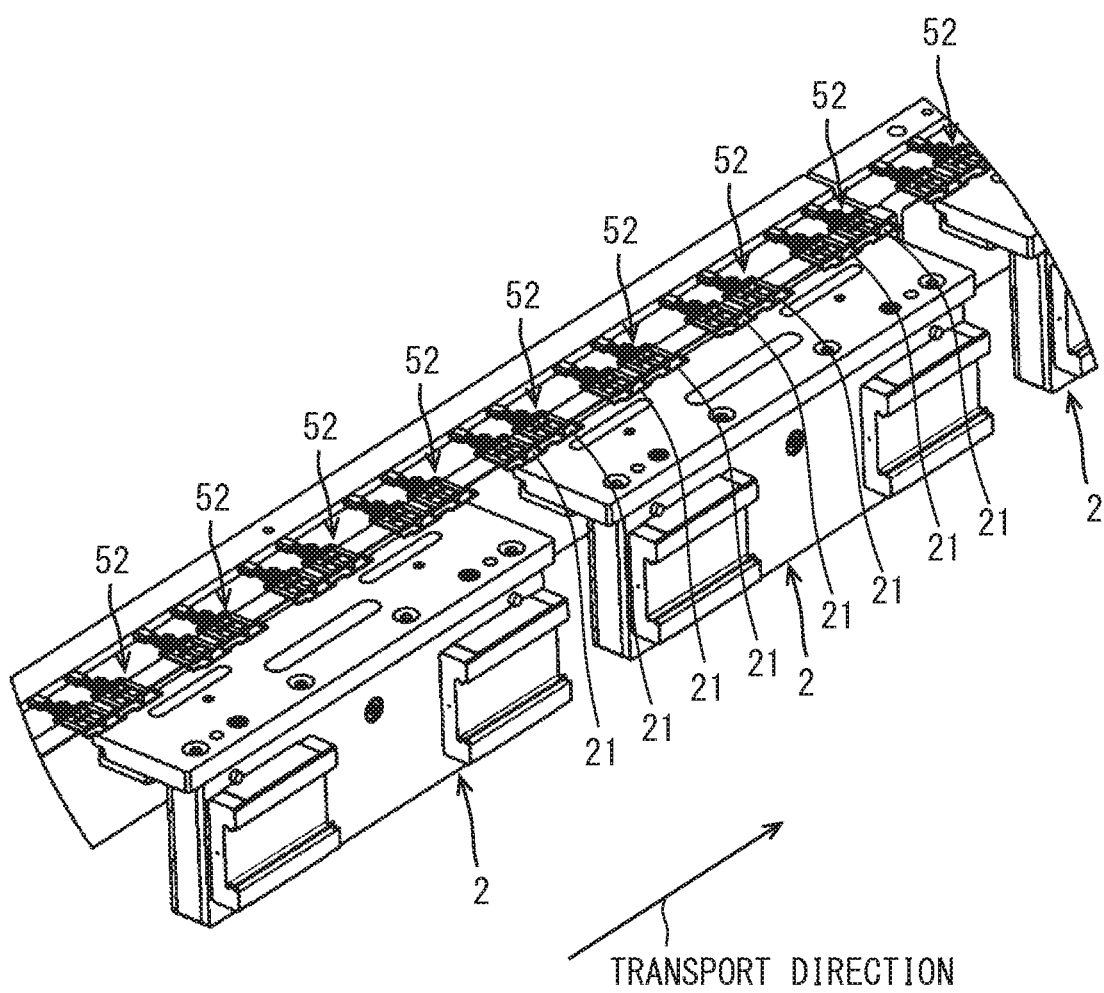
FIG. 6 is a partial perspective view showing works supported by the transport unit in the manufacturing device according to the first embodiment.
Figure 8:
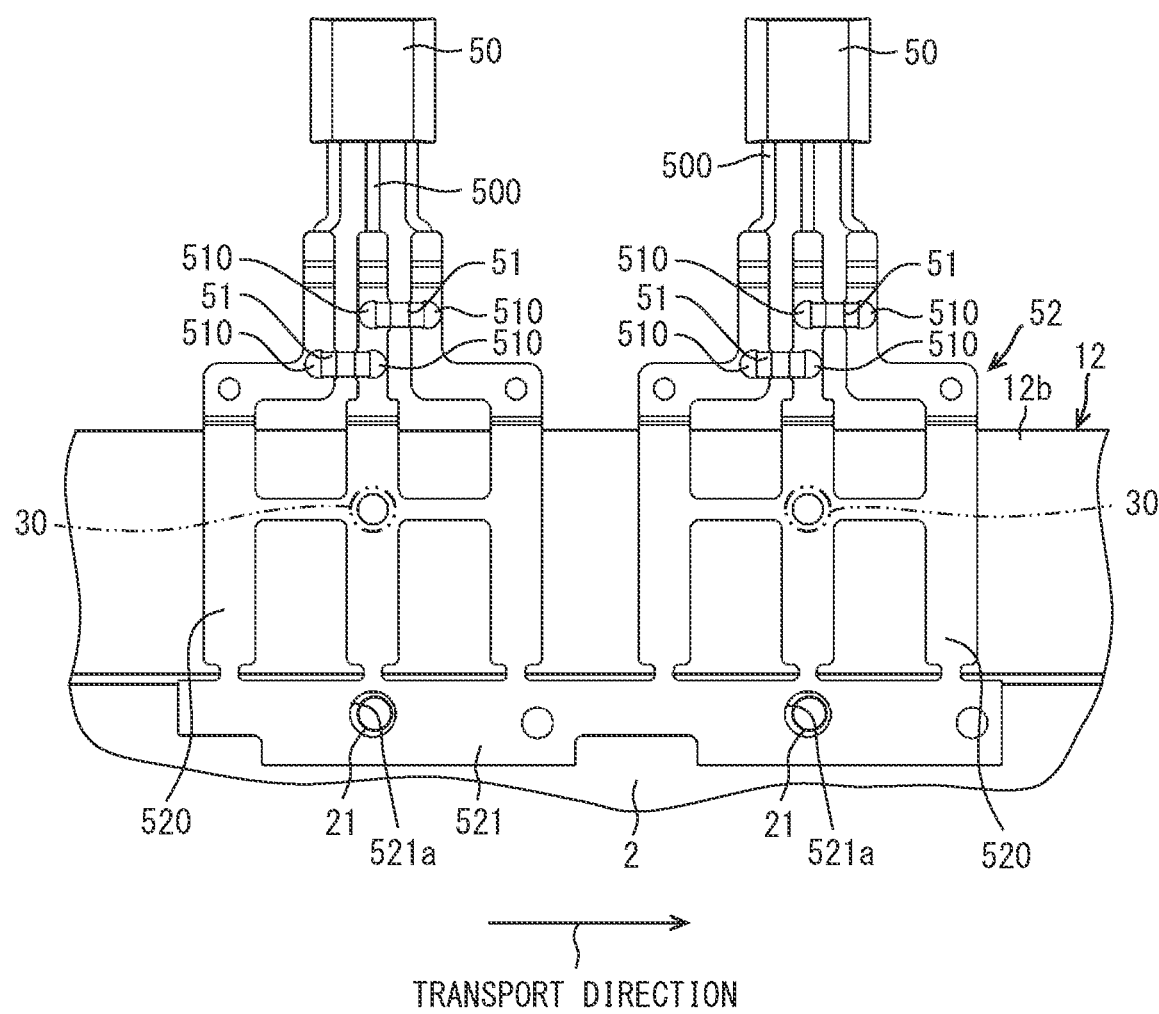
FIG. 8 is a view showing the manufacturing device in which the work stops to come into contact with the melting heating section, according to the first embodiment.

FIGS. 6 and 8 show a state in which the works 52 are supported by the transport unit 2 in the manufacturing device. The transport unit 2 supports each work 52 by the pin-shaped portions of the support devices 21 being fitted into the holes 521a from below. The pin-shaped portion supports the connecting portion 521 at a position corresponding to each terminal 520 in the transport direction. Therefore, the support devices 21 supports each work 52 at two positions along the transport direction. The hole 521a is formed so that its inner diameter is larger than the outer diameter of the pin-shaped portion. Therefore, when the pin-shaped portion is fitted in the hole 521a, a clearance is generated between the pin-shaped portion and the hole 521a, which contributes to facilitating a process of supporting the work 52 by the support device 21.

Figure 9:
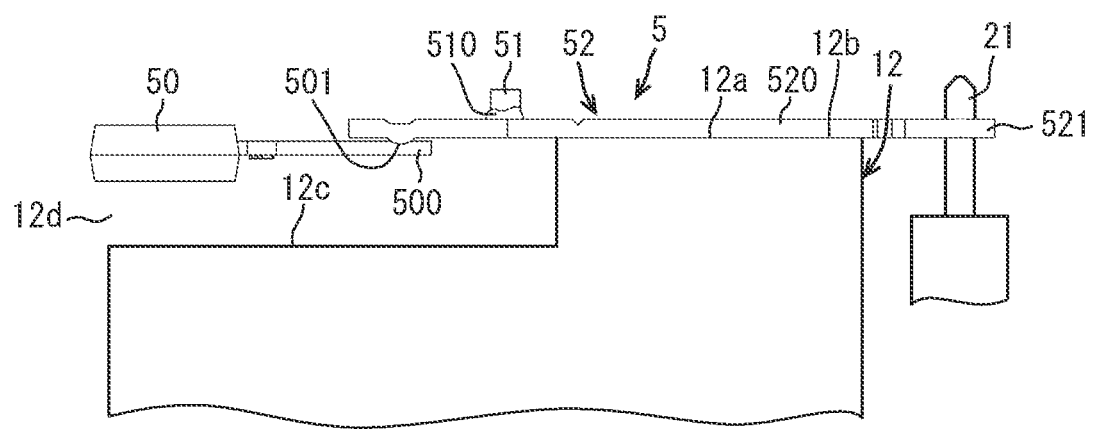
FIG. 9 is a side view showing the manufacturing device in which the work is in contact with the melting heating section, according to the first embodiment.

As shown in FIG. 6, the manufacturing device has multiple transport units 2, and each transport unit 2 supports four works 52 arranged in the transport direction. The melting heating member 12 is in contact with a contact heated portion of the terminal 520 without contacting the soldering portion 510 to be soldered to the second element 51. As shown in FIGS. 8 and 9, this contact heated portion is a portion of the terminal 520 in contact with an upper surface 12a of the melting heating member 12. The upper surface 12a includes a protrusion 12b contacting and heating the contact heated portion of the work 53, and a recess 12c separated from the soldering portion of the work 52. This contact heated portion is in a range between the soldering portion 510 and the connecting portion 521 in the terminal 520. Therefore, the soldering portion 510, the first element 50, and the welded joint portion 501 are located outside this contact heated portion. The recess 12c of the melting heater block has an opening 12d that faces in a direction parallel to an upper surface of the protrusion and perpendicular to the transport direction.

The method of manufacturing the electric component includes a preparatory step of preparing a solder for soldering the second element 51 to the terminal 520, an installation step of installing the second element 51 on the soldering portion 510 of the terminal 520, a preheating step, an intermediate heating step, a melting heating step, and a cooling step. The preparatory step is a step of applying solder to the soldering portion 510 with respect to the terminal 520 to which the first element 50 has already been welded. The installation step is a step of installing the second element 51 at a predetermined position so that the conductive portion of the second element 51 contacts the soldering portion 510 with respect to all the works 52 placed on the manufacturing line 1.

At the preheating step, after the installation step, the terminal 520 is stopped and in contact with the preheating member 10 set at a preheating temperature lower than the solder meltable temperature, and the terminal 520 is preheated by the preheating member 10. At the preheating step, the works 52 are stepwise fed one by one. For example, the works 25 are stopped until, for example, four seconds have elapsed since a start of movement from a last stopped state. Therefore, each work 52 is preheated for eighty seconds at the preheating step. At the intermediate heating step, after the preheating step, the terminal 520 is transported out from the stopped state of the preheating step, and the terminal 520 is stopped and heated while contacting the intermediate heating member 11 set at a temperature between the preheating temperature and the solder meltable temperature. Also at the intermediate heating step, the works 52 are stepwise fed one by one. For example, the works 25 are stopped until four seconds have elapsed since a start of movement from a last stopped state. Thus, each work 52 is heated for eight seconds at the intermediate heating step.

At the melting heating step, after the intermediate heating step, the terminal 520 is transported out from the stopped state of the intermediate heating step, and the terminal 520 is stopped and heated by the melting heating member 12 while contacting the melting heating member 12 set at the solder meltable temperature. Also at the melting heating step, the works 52 are stepwise fed one by one. For example, the works 25 are stopped until four seconds have elapsed since a start of movement from a last stopped state. Thus, each work 52 is heated for forty seconds at the melting heating step. At the cooling step, after the melting heating step, the terminal 520 is transported out from the stopped state of the melting heating step, and the terminal 520 is stopped and cooled by the cooling member 13 while contacting the cooling member 13 having the temperature at which the solder solidifies. Also at the cooling step, the works 52 are stepwise fed one by one. For example, the works 25 are stopped until four seconds have elapsed since a start of movement from a last stopped state. Thus, each work 52 is cooled for eight seconds at the cooling step.

Figure 10:
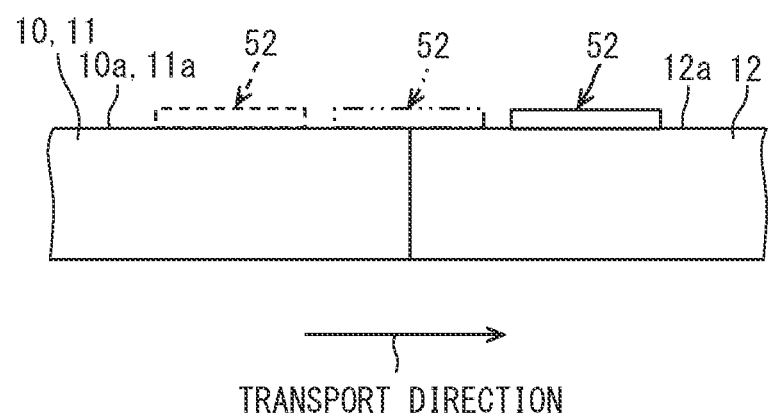
FIG. 10 is a schematic diagram showing the work moving from a preheating section to the melting heating section.

According to the control of operations of the transport unit 2 at each step, all the works 52 on the manufacturing line 1 are stepwise moved by the predetermined pitch at the same time, and then stopped for the predetermined time. The works 52 are again moved stepwise by the predetermined pitch and then stopped for the predetermined time, repeatedly. That is, the transport unit 2 repeats a short-time stepwise transport of the works 52, as shown in FIG. 10, from the dash-lined work 52 to the solid-lined work 52. According to the operation of the transport unit 2, the work 52 passes between members having different temperatures in a short time. Thus, each work 52 does not stop while being in contact with both the preheating member 10 and the intermediate heating member 11 at the same time. Each work 52 does not stop while being in contact with both the intermediate heating member 11 and the melting heating member 12 at the same time. That is, the work 52 does not stop at a position of the work 52 shown by the dashed-two dotted line in FIG. 10 throughout the manufacturing process. As a result, large temperature variation within each work 52 in the transport direction can be avoided throughout the manufacturing process.

Figure 11:
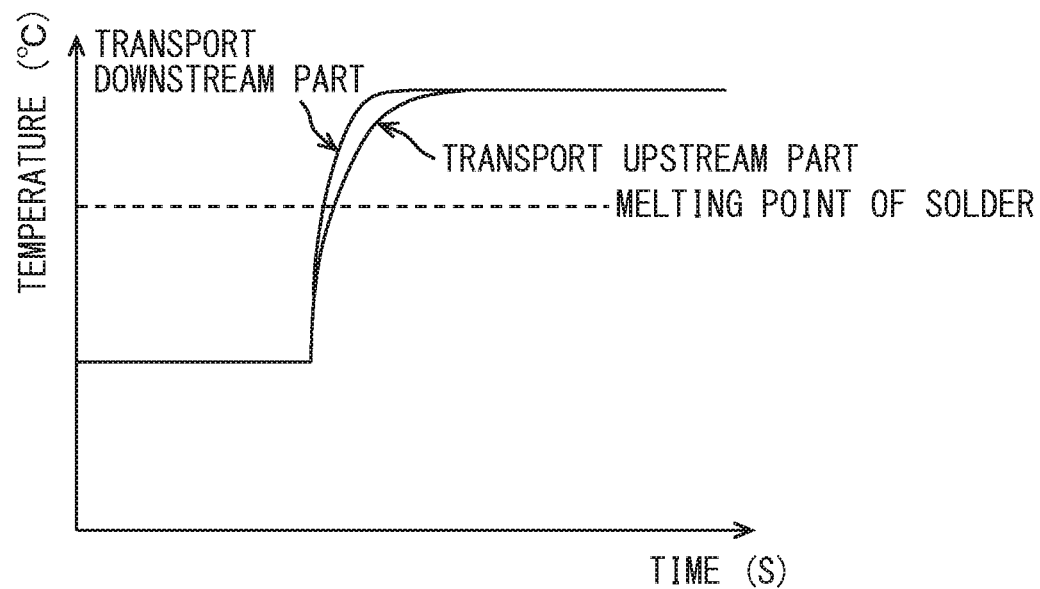
FIG. 11 is a diagram showing a temperature change of the work at a preheating step and a melting heating step in the manufacturing device according to the first embodiment.

FIG. 11 shows a temperature change of the work 52 at the preheating step and the melting heating step in the manufacturing device and method, in which the intermediate heating member 11 is not provided. In this manufacturing device, the work 52 moves quickly from the stopped state on the preheating member 10 to the stopped state on the melting heating member 12. Thus, a transport-upstream terminal 520, which is one of the two terminals 520 on a transport-upstream side of the work 52, also moves quickly from the preheating member 10 to the melting heating member 12. According to this intermittent transport, the transport-upstream terminal 520 can be made in contact with the melting heating member 12 for almost the same time period as a transport-downstream terminal 520 which is another of the two terminals 520 on a transport-downstream side of the work 52. The term "transport-upstream" means a direction opposite from the direction in which the transport unit 2 proceeds in the manufacturing process. Therefore, the transport-upstream terminal 520 corresponds to the left terminal 520 in FIG. 8.

As shown in FIG. 11, a temperature change of the transport-upstream terminal 520 is not so different from a temperature change of the transport-downstream terminal 520 in a time period from a start of the stopped state on the preheating member 10 to an end of the stopped state on the melting heating member 12. Although the temperature of the work 52 rapidly rises in an initial stage of the stopped state on the melting heating member 12, a difference in period of time for temperature rising between the transport-upstream terminal 520 and the transport-downstream terminal 520 is small. As a result, a difference in period of time for solder melting in the transport direction of the work 52 can be reduced. Thus, a non-uniform solder molten state can be reduced, and contribution to improvement of soldering connection can be provided.

Figure 12:
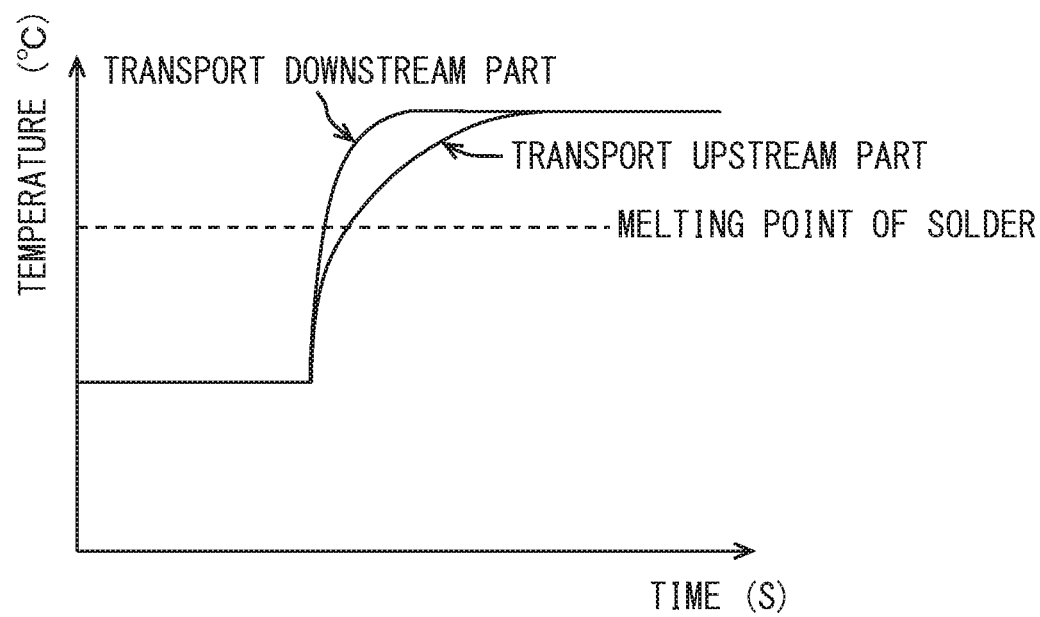
FIG. 12 is a diagram showing a temperature change of a work at a preheating step and a melting heating step in a manufacturing device according to a comparative example.

In contrast, FIG. 12 shows a temperature change of the work 52 at the preheating step and the melting heating step in a manufacturing device according to a comparative example. The manufacturing device of the comparative example continuously transports the work 52 at a constant speed over both the preheating area and the melting heating area, instead of the intermittent transport. In this case, in the work 52, the transport-upstream terminal 520 is shorter than the transport-downstream terminal 520 in period of time for receiving heat from the melting heating member. Therefore, as shown in FIG. 12, in the work 52, a temperature change of the transport-upstream terminal 520 is more gentle than a temperature change of the transport-downstream terminal 520. That is, FIG. 12 shows that the temperature difference in the transport direction within the work 52 is larger than the temperature difference shown in FIG. 11. Due to this large temperature difference, a time lag occurs in solder melting, and the molten state becomes non-uniform. As a result, defects such as tombstones easily occur.

Figure 13:
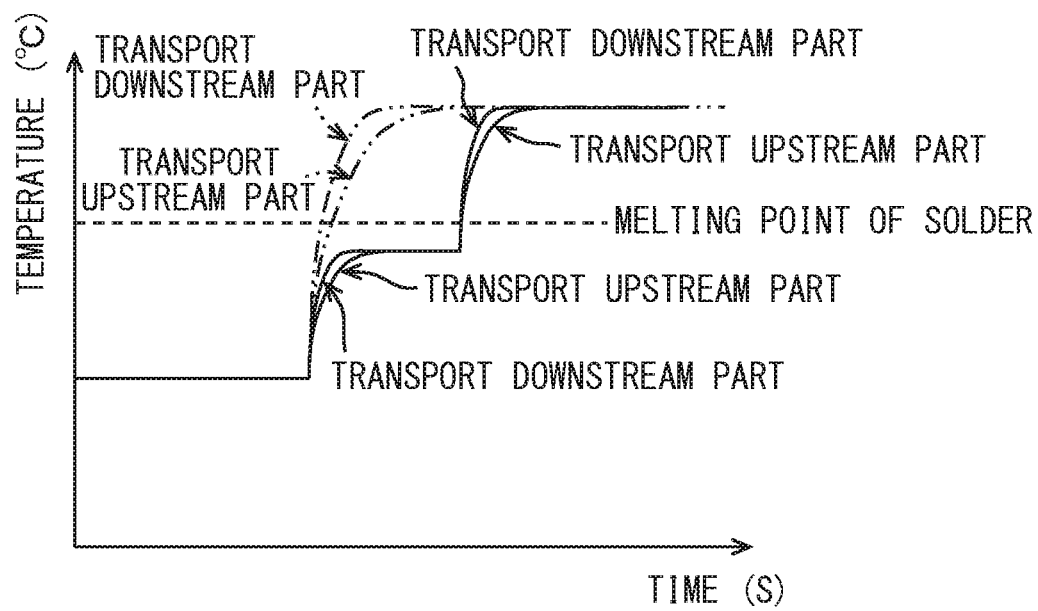
FIG. 13 is a diagram showing a temperature change of the work at a preheating step, an intermediate heating step and a melting heating step in the manufacturing device according to the first embodiment.

FIG. 13 shows a temperature change of the work 52 at the preheating step and the melting heating step in the manufacturing device and method, in which the intermediate heating member 11 is provided between the preheating member 10 and the melting heating member 12. Temperature changes shown by the dash-two dotted lines in FIG. 13 are the temperature changes shown in FIG. 11 in which the intermediate heating member 11 is not provided. In this manufacturing device, the work 52 moves quickly from the stopped state on the preheating member 10 to the stopped state on the intermediate heating member 11. Further, the work 52 moves quickly from the stopped state on the intermediate heating member 11 to the stopped state on the melting heating member 12. According to this intermittent transport, the transport-upstream terminal 520 can be made in contact with the intermediate heating member 11 for almost the same time period as the transport-downstream terminal 520.

As shown in FIG. 13, a temperature change of the transport-upstream terminal 520 is not so different from a temperature change of the transport-downstream terminal 520 in also a time period from a start of the stopped state on the preheating member 10 to an end of the stopped state on the intermediate heating member 11. Since the intermediate heating member 11 is provided, the temperature of the work 52 can be increased in stages toward the solder meltable temperature. Thus, the work 52 is easier to reach the solder meltable temperature, and the stop time of the work 52 in the melting heating area can be reduced.

Next, operational advantages according to the first embodiment will be described. The electric component manufacturing device of the first embodiment manufactures an electric component by soldering parts together by heat conducted to the transported work 52. One of the manufacturing devices includes the preheating section that preheats the work 52 which is in contact with the preheating section, the melting heating section that is provided transport-downstream of the preheating section, the cooling section that is provided transport-downstream of the melting heating section, and the transport unit that transports the work 52 so as to contact the preheating section, the melting heating section and the cooling section, in this order. The temperature of the melting heating section is set to be higher than the temperature of the preheating section. The solder can melt at the temperature of the melting heating section. The melting heating section heats the work 52 that is in contact with the melting heating section. The transport unit performs the intermittent transport in which the work 52 is moved from the preheating section to the melting heating section and stopped in the melting heating section without the work 52 stopping to contact both the preheating section and the melting heating section at the same time.

According to this manufacturing device, the work 52 is temperature-adjusted in each section while the work 52 contacting the preheating section, the melting heating section, and the cooling section, in this order. This heating method is based on heat transfer between solids rather than convection heating. Thus, an occupied volume of the manufacturing device can be reduced. The transport unit performs the intermittent transport in which the work 52 is moved from the preheating section to the melting heating section without the work 52 stopping to contact both the preheating section and the melting heating section at the same time. In this way, a period of time in which both the preheating section and the melting heating section simultaneously heat the work 52 can be effectively shortened. Thus, a period of time in which the entire work 52 is heated in the melting heating section can be sufficiently secured. Accordingly, in the process of melting the solder, it is possible to realize heating of the work 52 so as to reduce the temperature difference within the work 52 along the transport direction.

Thus, failures such as tombstones can be reduced. As described above, the manufacturing device contributes to downsizing of the entire device and reduction in temperature difference in the work 52.

The electric component manufacturing device includes the melting heating section provided transport-downstream of the preheating section. The melting heating section is set at the solder meltable temperature that is higher than the temperature of the preheating section. The melting heating section contacts and heats the contact heated portion of the work 52 without contacting the soldering portion 510 soldered to a component.

According to this manufacturing device, in the melting heating section, heat is applied to the contact heated portion of the work 52 other than the soldering portion 510 soldered to a component. Thus, excessive flow of the solder can be reduced. Since excessive melting of the solder is reduced, molten solder can be prevented from flowing and adhering to the melting heating member 12. This manufacturing device contributes to downsizing of the entire device and reduction in solder flow.

The electric component manufacturing device further includes the contact force increaser that provides a force to increase a degree of contact between the melting heating section and the work 52 stopped in the melting heating section. According to this manufacturing device, the degree of contact between the terminal 520 and the melting heating section can be increased as compared with a state in which the work 52 is just placed on and contacts the melting heating section. Due to this contact-force increase effect, the heat of the melting heating section can be efficiently transferred to the terminal 520. Thus, a molten state of the solder can be set to a desired state, and more secure soldering connection can be provided.

The work 52 includes the terminal 520 and an element soldered to the terminal 520. The melting heating section is in contact with a contact heated portion of the terminal 520 without contacting the soldering portion 510 soldered to the element. According to this manufacturing device, the contact heated portion of the terminal 520 which is in contact with the melting heating section does not include the soldering portion 510. Thus, the solder can be melted while a temperature of the soldering portion 510 does not rise excessively. Hence, excessive reduction in viscosity of molten solder can be suppressed, and thus, excessive flow and adhesion of the molten solder to the melting heating member 12 can be avoided.

The electric component manufacturing device further includes an intermediate heating section provided between the preheating section and the melting heating section. The intermediate heating section is set at a temperature included between the temperature of the preheating section and the temperature of the melting heating section. The transport unit 2 performs intermittent transport in which the work 52 is stopped in the preheating section, moved from the preheating section to the intermediate heating section, and stopped in the intermediate heating section. According to this manufacturing device, the work 52 in the stopped state is moved from the preheating section to the intermediate heating section and stopped. Then, the work 52 in the stopped state is moved from the intermediate heating section to the melting heating section and stopped. Accordingly, a period of time during which the work 52 is heated simultaneously by both the preheating section and the intermediate heating section can be shortened. A period of time during which work 52 is heated simultaneously by both the intermediate heating section and the melting heating section can be shortened. Thus, a sufficient time for heating the entire work 52 in the intermediate heating section or the melting heating section can be secured. Therefore, heating of the work 52 can be performed while a temperature difference within the work 52 in the transport direction is reduced. Failures such as tombstones can be reduced. Further, the intermediate heating section is provided between the preheating section and the melting heating section. The temperature setting for heating the work 52 becomes more stepwise, which contributes to gradual temperature change of the work 52.

One of the manufacturing method of the electric component includes a step of preparing a solder for soldering the second element 51 to the terminal 520, and an installation step of installing the second element 51 on the soldering portion 510 of the terminal 520. This manufacturing method further includes a preheating step, a melting heating step, and a cooling step. At the preheating step, after the installation step, the terminal 520 is stopped and in contact with the preheating member 10 having a preheating temperature lower than the solder meltable temperature, and the terminal 520 is preheated by the preheating member 10. At the melting heating step, after the preheating heating step, the terminal 520 is transported out from the stopped state of the preheating step, and the terminal 520 is stopped and heated by the melting heating member 12 while contacting the melting heating member 12 having the solder meltable temperature. At the cooling step, after the melting heating step, the terminal 520 is transported, stopped, and then cooled by the cooling member 13 while the terminal 520 contacting the cooling member 13 having the temperature at which the solder solidifies. Accordingly, an element is soldered to the terminal 520.

According to this manufacturing method, the temperature of the work 52 is adjusted while the work 52 sequentially contacting the preheating member 10, the melting heating member 12, and the cooling member 13 in this order. Thus, an occupied volume of the manufacturing device can be reduced. Further, in the manufacturing method, the work 52 in the stopped state is moved from the preheating member 10 to the melting heating member 12 and stopped on the melting heating member 12. Thus, a period of time in which both the preheating member 10 and the melting heating member 12 simultaneously heat the work 52 can be effectively shortened. Thus, a period of time in which the entire work 52 is heated by the melting heating member 12 can be sufficiently secured. According to this manufacturing method, in the process of transporting the work 52, heating of the work 52 can be performed while the temperature difference within the work 52 along the transport direction is reduced. Thus, failures such as tombstones can be reduced. The manufacturing method of the electric component contributes to downsizing of the entire manufacturing device and reduction in temperature difference in the work 52.

At the preheating step and the melting heating step, the preheating member 10 and the melting heating member 12 come into contact with the contact heated portion of the terminal 520 without contacting the soldering portion 510. According to this manufacturing method, in the melting heating member 12, heat is applied to the contact heated portion of the work 52 other than the soldering portion 510 soldered to the second element 51. Thus, excessive flow of the solder can be reduced. Accordingly, molten solder can be prevented from flowing and adhering to the melting heating member 12. This manufacturing method contributes to downsizing of the entire device and reduction in solder flow.

At the melting heating step, an external force is provided to increase a degree of contact between the melting heating member 12 and the work 52 stopped on the melting heating member 12. According to this manufacturing method, the degree of contact between the terminal 520 and the melting heating member 12 can be increased as compared with a state in which the work 52 is just placed on and contacts the melting heating member 12. Due to this contact-force increase effect, the heat of the melting heating member 12 is efficiently transferred to the terminal 520. Thus, soldering connection between the terminal 520 and the second element 51 can be performed more reliably.

Second Embodiment

A second embodiment will be described with reference to FIG. 14. In the second embodiment, components provided with the same reference signs as those in the drawings of the first embodiment and structures which are not described are similar to those of the first embodiment and have similar workings and effects. In the second embodiment, only the differences from the first embodiment will be described.

Figure 14:
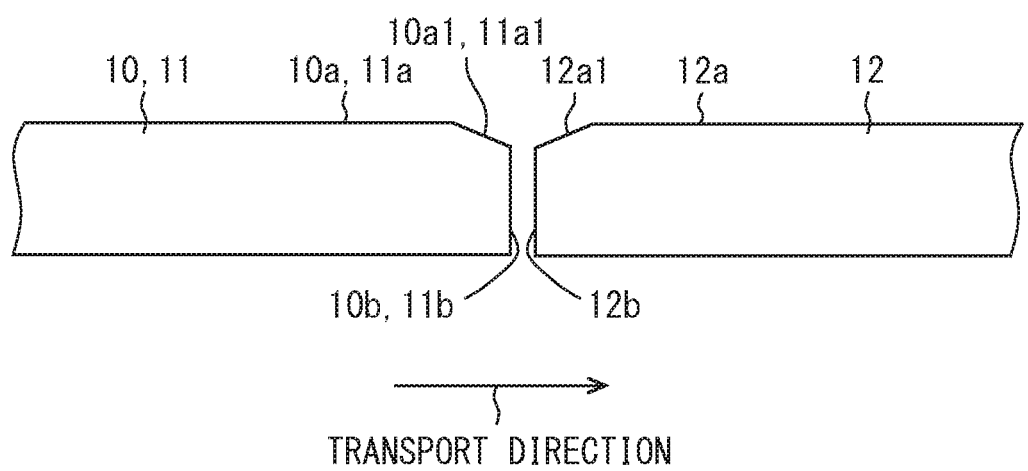
FIG. 14 is a view showing shapes of end portions of a preheating member or an intermediate heating member and a melting heating member which are next to each other in a manufacturing device of a second embodiment.

As shown in FIG. 14, a gap is provided between the preheating member 10 and the melting heating member 12 which are next to each other. A gap is provided between the intermediate heating member 11 and the melting heating member 12 which are next to each other. Further, a gap may be provided between the melting heating member 12 and the cooling member 13 which are next to each other. A gap may be provided between the preheating member 10 and the intermediate heating member 11 which are next to each other. These gaps are set so that the transported work 52 does not fall off the manufacturing line 1.

The preheating member 10 includes a corner portion 10a1 having a surface structure in which an upper surface 10a gradually becomes lower toward a transport-downstream end surface 10b that faces the adjacent intermediate heating member 11 or the adjacent melting heating member 12. The intermediate heating member 11 includes a corner portion 11a1 having a surface structure in which an upper surface 11a gradually becomes lower toward a transport-downstream end surface 11b that faces the adjacent melting heating member 12. The intermediate heating member 11 includes a corner portion having a surface structure in which the upper surface 11a gradually becomes lower toward a transport-upstream end surface that faces the adjacent preheating member 10. The melting heating member 12 includes a corner portion 12a1 having a surface structure in which an upper surface 12a gradually becomes lower toward a transport-upstream end surface 12b that faces the adjacent preheating member 10 or the adjacent intermediate heating member 11. These corner portions may have a curved surface or a chamfered shape. These corner portions have a size so that the work 52 can be stably and smoothly transported on the manufacturing line 1.

The manufacturing device according to the second embodiment contributes to smooth sliding of the work 52 between the adjacent members in the manufacturing line 1 when the work 52 is transported by the transport unit 2. Therefore, according to the second embodiment, it is possible to provide a manufacturing device having excellent productivity.

Third Embodiment

A third embodiment will be described with reference to FIGS. 15 and 16. In the third embodiment, components provided with the same reference signs as those in the drawings of the first embodiment and structures which are not described are similar to those of the first embodiment and have similar workings and effects. In the third embodiment, only the differences from the first embodiment will be described.

Figure 15:
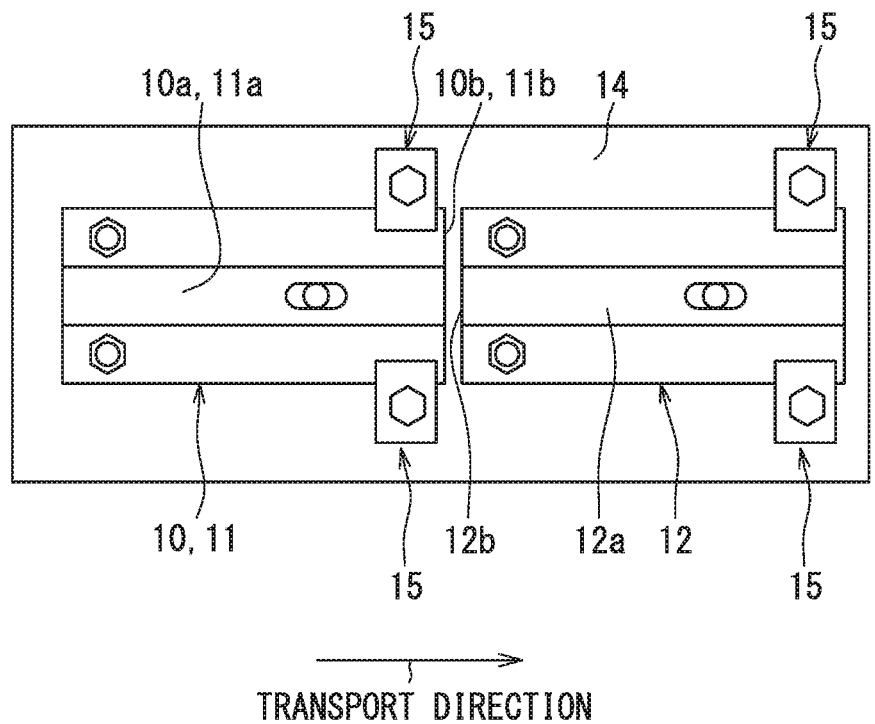
FIG. 15 is a top view showing a fixing structure of a preheating member, an intermediate heating member, and a melting heating member with respect to a seat member in a manufacturing device according to a third embodiment.
Figure 16:
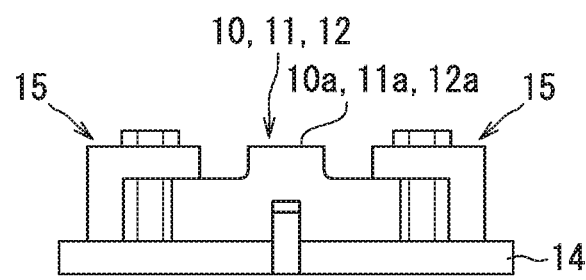
FIG. 16 is a view of the fixing structure relating to the preheating member, the intermediate heating member, and the melting heating member, as viewed in a transport direction of the work.

As shown in FIGS. 15 and 16, the preheating member 10, the intermediate heating member 11, and the melting heating member 12 are each fixed to a seat member 14 on an either end side thereof in the transport direction. The preheating member 10, the intermediate heating member 11, and the melting heating member 12 each include a fixed portion 15 that is fixed to the seat member 14 on an either of a transport-upstream end part or a transport-downstream end part thereof. The fixed portion 15 is provided at one position in the transport direction in each of the preheating member 10, the intermediate heating member 11, and the melting heating member 12. Therefore, each of the preheating member 10, the intermediate heating member 11, and the melting heating member 12 are each fixed to the seat member 14 at only one position in the transport direction.

According to the third embodiment, even if the preheating member 10, the intermediate heating member 11, and the melting heating member 12 are thermally expanded in the manufacturing process, deformation due to the thermal expansion can be released because each member has only one fixed site with respect to the seat member 14 in the transport direction. Therefore, large deformation of a contact surface of each member in contact with the work 52 can be avoided. It is possible to provide a manufacturing device capable of ensuring heat transfer to the work 52.

The disclosure in the present specification is not limited to the illustrated embodiments. The disclosure encompasses the illustrated embodiments and variations thereof by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure encompasses the omission of parts and elements of the embodiments. The disclosure encompasses the replacement or combination of components, elements between one embodiment and another. The disclosed technical scope is not limited to the description of the embodiment.

In the above-described embodiments, the work 52 has two terminals 520 arranged side by side in a traverse direction, but the number of terminals is not limited to two. For example, the work 52 may have a configuration having one terminal or three or more terminals.

In the above-described embodiments, the press device 3 is included in the contact force increaser that provides a force to increase the degree of contact between the work 52 and the melting heating section. The contact force increaser in the manufacturing device is not limited to the configuration in which the work 52 is pressed against the melting heating section like the press device 3. The contact force increaser may be configured to attract the work 52 to the melting heating section by suction force or the like. For example, a suction blower may be used as the contact force increaser.

The press device 3 in the above-described embodiments may be configured to provide a force to increase a degree of contact with the work 52 not only in the melting heating section but also in other sections. Accordingly, the degree of contact with the work 52 not only in the melting heating section but also in the other sections is enhanced, and an efficiency of heat transfer between the solids can be increased.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. An electric component manufacturing device for manufacturing an electric component by soldering a part to a transported work with heat conducted to the work, comprising:
    a preheater block configured to preheat the work that contacts the preheater block;
    a melting heater block provided downstream of the preheater block in a transport direction and configured to heat the work that contacts the melting heater block, the melting heater block having a temperature at which a solder melts and which is higher than a temperature of the preheater block, an upper surface of the melting heater block having a protrusion contacting and heating a contact heated portion of the work;
    a cooler block provided downstream of the melting heater block in the transport direction and configured to cool the work that contacts the cooler block;
    a transporter, which includes a support, configured to support the work such that the work is slidable on the preheater block, the melting heater block, and the cooler block;
    a transport drive device, which includes an actuator, configured to provide a driving force for transporting the transporter in the transport direction;
    a press located directly above the protrusion of the melting heater block and configured to approach and to release the melting heater block in a vertical direction to press the work against the protrusion of the melting heater block when the work is stopped on the melting heater block during intermittent transport; and
    a controller configured to control the transport drive device and the press wherein
    the controller controls the transport drive device and the press to perform the intermittent transport in which the transporter is transported such that:
        the work slides on the preheater block, the melting heater block, and the cooler block in this order;
        the work slides from the preheater block to the melting heater block through a contact position at which the work contacts both the preheater block and the melting heater block at the same time without the work stopping at the contact position; and
        the work stops on the melting heater block and the stopped work is pressed against and released from the melting heater block by the press.

2. The electric component manufacturing device according to claim 1, wherein
    the melting heater block does not contact a soldering portion of the work that is to be soldered to the part,
    the upper surface of the melting heater block includes a recess separated from the soldering portion of the work, and
    the protrusion is between the recess and the support.

3. The electric component manufacturing device according to claim 1, further comprising
    an intermediate heater block provided between the preheater block and the melting heater block, the intermediate heater block having a temperature between the temperature of the preheater block and the temperature of the melting heater block, wherein
    the controller controls the transport drive device to perform intermittent transport in which:
        the transporter stops the work on the preheater block;
        the transporter transports the work from the preheater block to the intermediate heater block; and
        the transporter stops the work on the intermediate heater block.

4. The electric component manufacturing device according to claim 1, wherein
    the press has a circular shape in a cross section parallel to an upper surface of the protrusion of the melting heater block.

5. The electric component manufacturing device according to claim 4, wherein
    the press has a diameter smaller than the upper surface of the protrusion of the melting heater block in the cross-section.

6. The electric component manufacturing device according to claim 1, wherein
    the press has a shape smaller than an upper surface of the protrusion of the melting heater block in a direction parallel to the upper surface of the protrusion and perpendicular to the transport direction.

7. The electric component manufacturing device according to claim 3, wherein
    the recess of the melting heater block has an opening that faces in a direction parallel to an upper surface of the protrusion and perpendicular to the transport direction.

8. An electric component manufacturing device for manufacturing an electric component by soldering a part to a transported work with heat conducted to the work, comprising:
    a preheater block configured to contact and preheat the work;
    a melting heater block provided downstream of the preheater block in a transport direction and configured to contact and heat a contact heated portion of the work without contacting a soldering portion of the work that is to be soldered to the part, the melting heater block having a temperature at which a solder melts and which is higher than a temperature of the preheater block, an upper surface of the melting heater block including a protrusion contacting and heating the contact heated portion of the work;
    a cooler block provided downstream of the melting heater block in the transport direction and configured to cool the work that contacts the cooler block;
    a transporter configured to support and transport the work such that the work sequentially contacts the preheater block, the melting heater block, and the cooler block in this order;
    a press located directly above the protrusion of the melting heater block and configured to approach and to release the melting heater block in a vertical direction to press the work against the protrusion of the melting heater block when the work is stopped on the melting heater block; and
    a controller configured to control the press such that the work stops on the melting heater block and the stopped work is pressed against and released from the melting heater block by the press, wherein the transporter, which includes a support, is configured to support the work, the upper surface of the melting heater block includes a recess separated from the soldering portion of the work, and the protrusion is between the recess and the support.

9. The electric component manufacturing device according to claim 5, further comprising an intermediate heater block provided between the preheater block and the melting heater block, the intermediate heater block having a temperature between the temperature of the preheater block and the temperature of the melting heater block.

\* \* \* \* \*